(12) United States Patent
Oyama et al.

(10) Patent No.: US 7,737,767 B2
(45) Date of Patent: Jun. 15, 2010

(54) CONTROL CIRCUIT AND CONTROL METHOD FOR CHARGE PUMP CIRCUIT

(75) Inventors: Manabu Oyama, Kyoto (JP); Daisuke Uchimoto, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 12/270,089

(22) Filed: Nov. 13, 2008

(65) Prior Publication Data
US 2009/0121782 A1    May 14, 2009

(30) Foreign Application Priority Data
Nov. 13, 2007    (JP) ............... 2007-294681

(51) Int. Cl.
*G05F 1/10* (2006.01)
(52) U.S. Cl. .................... 327/536; 363/60
(58) Field of Classification Search ............. 327/536; 363/59–60
See application file for complete search history.

(56) References Cited

U.S. PATENT DOCUMENTS

| | | | | |
|---|---|---|---|---|
| 6,107,862 A | * | 8/2000 | Mukainakano et al. | 327/536 |
| 6,400,211 B1 | * | 6/2002 | Yokomizo et al. | 327/536 |
| 6,744,224 B2 | * | 6/2004 | Ishii | 315/291 |
| 6,798,262 B2 | * | 9/2004 | Zhang | 327/175 |
| 7,298,198 B2 | * | 11/2007 | Stopel | 327/536 |
| 7,430,133 B1 | * | 9/2008 | McIntyre et al. | 363/60 |
| 2003/0122610 A1 | * | 7/2003 | Zeng et al. | 327/536 |
| 2008/0129265 A1 | * | 6/2008 | Rosenthal | 323/283 |
| 2009/0027022 A1 | * | 1/2009 | Oyama et al. | 323/282 |

FOREIGN PATENT DOCUMENTS

JP    2000-262043    9/2000

* cited by examiner

*Primary Examiner*—Lincoln Donovan
*Assistant Examiner*—Thomas J Hiltunen
(74) *Attorney, Agent, or Firm*—Cantor Colburn LLP

(57) ABSTRACT

A pulse frequency modulator generates a pulse signal having a fixed duty ratio and a frequency which is adjusted such that a feedback voltage corresponding to the output voltage of a charge pump circuit is coincident with a predetermined first reference voltage. A driver, on receiving the pulse signal, turns on a first or second group of switches during the time periods corresponding to the high time periods of the pulse signal and turns on the other ones of the first and second group of switches during the time periods corresponding to the low time periods of the pulse signal.

8 Claims, 3 Drawing Sheets

CONTROL CIRCUIT AND CONTROL METHOD FOR CHARGE PUMP CIRCUIT

BACKGROUND OF THE INVENTION

1. Field of the Invention

The present invention relates to a charge pump circuit.

2. Description of the Related Art

Recent electronic apparatuses such as cellular phones and PDAs (Personal Digital Assistants) have incorporated devices which require driving voltages larger than battery voltages, such as LEDs (Light Emitting Diodes) used as back lights for liquid crystal displays. For example, these small-sized information terminals frequently employ Li-ion batteries which output voltages of about 3.5 V in general and output voltages of about 4.2 V even at fully-charged states, while LEDs require voltages larger than such battery voltages, as driving voltages therefor. In cases where a voltage larger than a battery voltage is required as described above, a charge pump circuit and a switching regulator are used for boosting the battery voltage for generating a voltage required for driving LEDs.

A charge pump circuit generates an output voltage by multiplying an input voltage by a predetermined voltage-boosting ratio. For example, in the case where the battery voltage is 3 V and the voltage-boosting ratio is 2, the output voltage is fixed to 6V. Accordingly, when a load circuit requires a driving voltage lower than 6V, there has been a need for inserting a power transistor in the input side or the output side of the charge pump circuit to constitute a linear regulator for adjusting the ON resistance thereof for adjusting the output voltage. For example, a relating technique is described in Japanese Patent Application (Laid Open) No. 2000-262043.

In the case of utilizing the technique described in Japanese Patent Application (Laid Open) No. 2000-262043, there is a need for using a power transistor, thereby increasing the number of components of the circuit and the area of the circuit.

SUMMARY OF THE INVENTION

The present invention is made in view of the aforementioned problem and a general purpose thereof is to provide a charge pump circuit capable of adjusting the output voltage to a desired value while suppressing the increase of the scale of the circuit.

According to an embodiment of the present invention, there is provided a control circuit for a charge pump circuit including at least a single flying capacitor and at least a single output capacitor. The control circuit includes: a first group of switches including at least a single switch provided on a path which charges the flying capacitor using an input voltage; a second group of switches including at least a single switch provided on a path which charges the output capacitor using the electric charge accumulated in the flying capacitor; a pulse modulator which generates a pulse signal having a fixed duty ratio and a frequency which is adjusted such that a feedback voltage corresponding to the output voltage of the charge pump circuit is coincident with a predetermined first reference voltage; and a driver which, on receiving the pulse signal, turns on one of the first and second groups of switches during the time periods corresponding to the high time periods of the pulse signal and turns on the other one of the first and second groups of switches during the time periods corresponding to the low time periods of the pulse signal.

The output impedance of the charge pump circuit, namely the load driving capacity thereof, depends on the switching frequency. Therefore, the output voltage is fed back, and the switching frequency is adjusted, which may maintain the output voltage at a constant value, without providing a linear regulator. With this embodiment, it is possible to reduce the electric power consumption or increase the efficiency of the power supply, since the switching frequency is reduced when the load is smaller.

The pulse modulator may include: an error amplifier which amplifies the error between the feedback voltage and the first reference voltage and generates an error voltage; a charging/discharging capacitor which is fixed in electric potential at its one end; an electric current source which generates a variable electric current corresponding to the error voltage; a charging/discharging circuit which charges the charging/discharging capacitor with a charging current proportional to the variable current in a charging state and discharges the charging/discharging capacitor with a discharging current proportional to the variable current in a discharging state; and a charging/discharging controller which compares the capacitor voltage generated at the other end of the charging/discharging capacitor with a predetermined upper limit voltage and a predetermined lower limit voltage and puts the charging/discharging circuit into the discharging state if the capacitor voltage reaches the upper limit voltage and puts the charging/discharging circuit into the charging state if the capacitor voltage drops to the lower limit voltage. The pulse modulator may change the level of the pulse signal at the timing of the transition between the charging state and the discharging state.

The charging current and the discharging current may be equal to each other. In this case, the duty ratio of the pulse signal may be set to 50%.

The charging/discharging circuit may include: a first current mirror circuit which supplies, to the charging/discharging capacitor, a first current which is generated by multiplied the variable current by a first factor; and a second current mirror circuit which may be switched between ON and OFF and extracts, from the charging/discharging capacitor, a second current which is generated by multiplying the variable current by a second factor, and the charging/discharging circuit outputs the first current as the charging current and outputs the differential current between the second current and the first current, as the discharging current. The charging/discharging controller may include: a first comparator which compares the capacitor voltage with the upper limit voltage and generates a first signal having a first edge at the timing when the capacitor voltage reaches the upper limit voltage; a second comparator which compares the capacitor voltage with the lower limit voltage and generates a second signal having a second edge at the timing when the capacitor voltage drops to the lower limit voltage; and a flip flop which is set and reset by the first and second edges of the first and second signals. The charging/discharging controller may output the output of the flip flop as the pulse signal and may switch the second current mirror between ON and OFF according to the output of the flip flop.

The second current may be twice the first current. In this case, the duty ratio of the pulse signal may be set to 50%.

The current source may include: a regulator which generates a predetermined second reference voltage; and a frequency setting transistor which is provided between the output terminal of the regulator and a fixed voltage terminal and is structured such that the error voltage is inputted to its control terminal, and the current source may output a current flowing through the frequency setting transistor, as the variable current.

In this case, the variable current I is expressed as follows, using the second reference voltage Vref2 and the ON resistance Ron of the frequency setting transistor.

$$I = Vref2/Ron$$

In this case, the ON resistance Ron of the frequency setting transistor is adjusted on the basis of the error voltage, thereby adjusting the variable current Iv according to the error voltage.

The current source may further include a maximum frequency setting resistance RT provided in serial to the frequency setting transistor, between the output terminal of the regulator and the fixed voltage terminal.

In this case, the variable current Iv is expressed as follows.

$$Iv = Vref2/(Ron+RT)$$

As the ON resistance Ron decreases, the variable current Iv increases, and the frequency of the pulse signal increases. The provision of the maximum frequency setting resistance RT can set the actual upper limit value of the variable current Iv at Imax=Vref2/RT, thereby setting a maximum frequency of the pulse signal.

The pulse modulator can include: an error amplifier which amplifies the error between the feedback voltage and the first reference voltage and generates an error voltage; and a ring oscillator which oscillates at a frequency corresponding to the error voltage.

According to another embodiment of the present invention, there is provided a charge pump circuit. The charge pump circuit includes: a flying capacitor; an output capacitor; and any one of the aforementioned control circuits which control the charging and discharging states of the flying capacitor and the output capacitor.

According to still another embodiment of the present invention, there is provided a control method for a charge pump circuit including at least a single flying capacitor and at least a single output capacitor. The method includes: amplifying the error between a feedback voltage corresponding to the output voltage of the charge pump circuit and a predetermined first reference voltage and generating an error voltage; generating a variable electric current corresponding to the error voltage; comparing the capacitor voltage generated in a charging/discharging capacitor which is fixed in electric potential at its one end with a predetermined upper limit voltage and a predetermined lower limit voltage, the capacitor voltage being generated at the other end of the charging/discharging capacitor; starting discharging the charging/discharging capacitor with a discharging current proportional to the variable current when the capacitor voltage reaches the upper limit voltage; starting charging the charging/discharging capacitor with a charging current proportional to the variable current when the capacitor voltage drops to the lower limit voltage; generating a pulse signal which is changed between a high level and a low level, on the basis of the result of the comparison of the capacitor voltage; and performing switching for, on the basis of the pulse signal, alternately repeating a step for charging the flying capacitor using an input voltage and a step for charging the output capacitor using the electric charge accumulated in the flying capacitor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
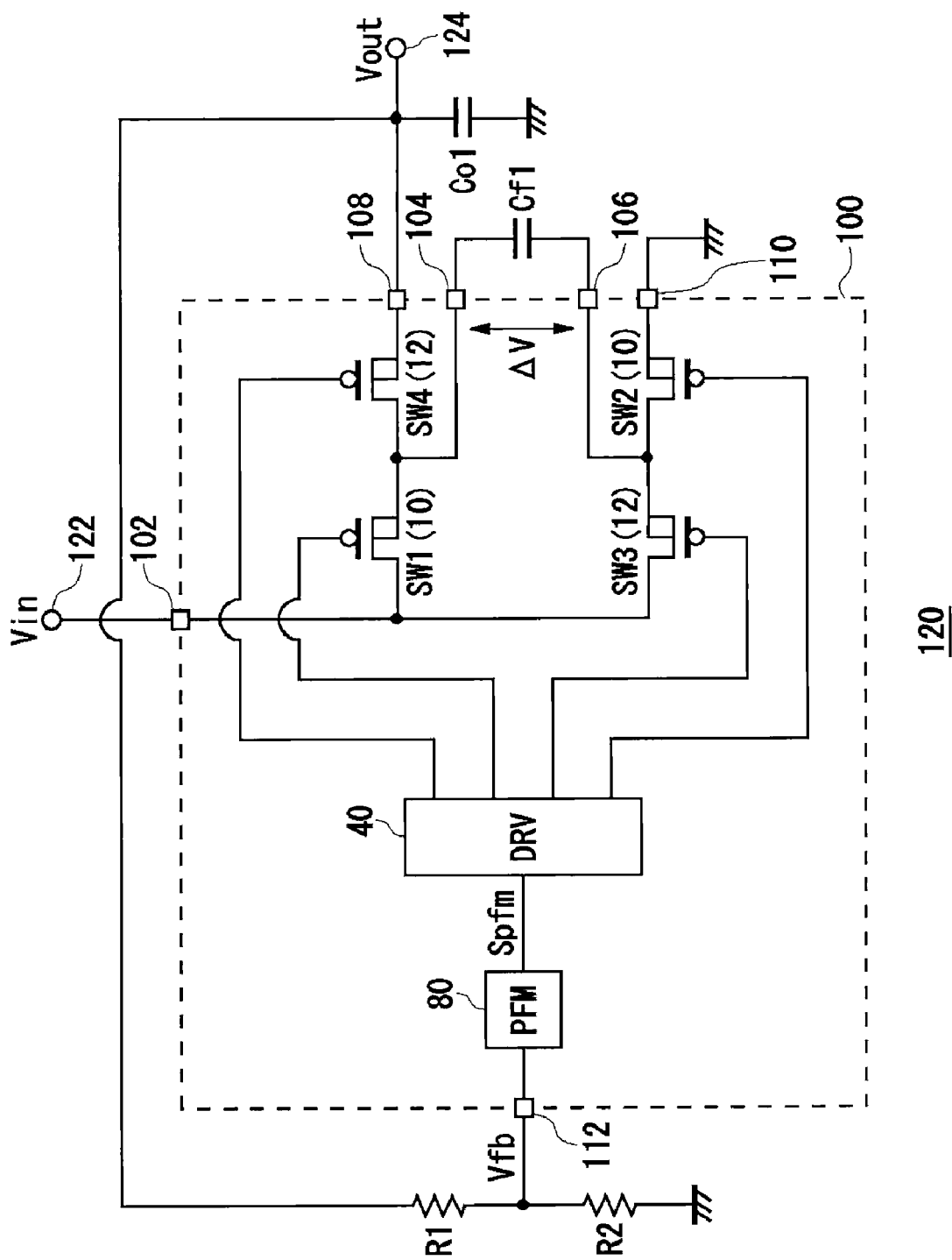
FIG. 1 is a circuit diagram illustrating the structure of a charge pump circuit according to an embodiment of the present invention.

The invention will now be described based on preferred embodiments which do not intend to limit the scope of the present invention but exemplify the invention. All of the features and the combinations thereof described in the embodiment are not necessarily essential to the invention.

In the present specification, "a state where a member A is connected to a member B" includes cases where the member A and the member B are physically directly connected to each other and cases where the member A and the member B are indirectly connected to each other such that another member which exerts no influence on the state of the electrical connection therebetween is interposed therebetween. Similarly, "a state where a member C is provided between a member A and a member B" includes cases where the member A and the member C or the member B and the member C are directly connected to each other and also includes cases where the member A and the member C or the member B and the member C are indirectly connected to each other such that another member which exerts no influence on the state of the electrical connection therebetween is interposed therebetween.

Further, in the present specification, the reference numerals provided to voltage signals, current signals, resistances and capacitors will indicate their respective voltage values, current values, resistance values and capacitance values.

FIG. 1 is a circuit diagram illustrating the structure of a charge pump circuit 120 according to an embodiment of the present invention. The charge pump circuit 120 boosts an input voltage Vin inputted to an input terminal 122 and outputs an output voltage Vout from an output terminal 124. The input voltage Vin can be a battery voltage outputted from a battery which is not shown or a power-supply voltage Vdd supplied from a power-supply circuit. The present invention can be applied to a charge pump circuit with an arbitrary voltage-boosting ratio. However, hereinafter, a charge pump circuit with a voltage-boosting ratio of 2 will be described, for ease of understanding.

The charge pump circuit 120 includes a control circuit 100, a flying capacitor Cf1, an output capacitor Co1, feedback resistances R1 and R2. The charge pump circuit in FIG. 1 has a voltage-boosting ratio of 2 and, therefore, includes a single flying capacitor Cf1 and a single output capacitor Co1. However, in cases of different voltage-boosting ratios or in cases of generating a plurality of output voltages, it is possible to employ a plurality of flying capacitors and a plurality of output capacitors.

The control circuit 100 includes a first group of switches 10, a second group of switches 12, a pulse frequency modulator 80 and a driver 40 which are monolithically integrated on a single semiconductor substrate to form a functional circuit. The input voltage Vin from the outside is applied to an input terminal 102. The flying capacitor Cf1 is connected between a capacitor terminal 104 and a capacitor terminal 106, and the output capacitor Co1 is connected between an output terminal 108 and the ground. A ground terminal 110 is grounded, and a feedback voltage Vfb corresponding to the output voltage Vout is inputted to a feedback terminal 112. The feedback voltage Vfb is a voltage resulted from the division of the output voltage Vout by the feedback resistances R1 and R2.

Generally, a charge pump circuit repeats a charging time period φ1 during which a flying capacitor is charged and a discharging time period φ2 during which an output capacitor is charged using the electric charge accumulated in the flying capacitor, thereby generating a boosted voltage.

The first group of switches 10 includes at least a single switch provided on the path which charges the flying capacitor Cf1 using the input voltage Vin. The first group of switches 10 and the flying capacitor Cf1 form a serial path between the input terminal 122 and the ground. In the present embodiment, the first group of switches 10 includes a first switch SW1 and a second switch SW2. More specifically, the first switch SW1 is provided between the input terminal 102 and the capacitor terminal 104, while the second switch SW2 is provided between the capacitor terminal 106 and the ground terminal 110. The first switch SW1 is a P-channel MOSFET (Metal Oxide Semiconductor Field Effect Transistor), while the second switch SW2 is an N-channel MOSFET.

The second group of switches 12 includes at least a single switch provided on the path which charges the output capacitor Co1 using the electric charge accumulated in the flying capacitor Cf1 during the charging time period φ1. In the present embodiment, the second group of switches 12 includes a third switch SW3 and a fourth switch SW4. More specifically, the third switch SW3 is provided between the input terminal 102 and the capacitor terminal 106, while the fourth switch SW4 is provided between the capacitor terminal 104 and the output terminal 108. The third switch SW3 and the fourth switch SW4 are both P-channel MOSFETs.

The driver 40 includes a level shift circuit and changes over the gate voltages of the first switch SW1 to the fourth switch SW4 for controlling the ON and OFF of them.

During the charging time period φ1, if both the first switch SW1 and the second switch SW2 are turned on, this causes the input voltage Vin to be applied to one end of the flying capacitor Cf1 while causing the other end thereof to be grounded, thereby charging the flying capacitor Cf1 with the input voltage Vin. It is assumed that the electric potential difference across the flying capacitor Cf1 is ΔV.

During the discharging time period φ2, if both the third switch SW3 and the fourth switch SW4 are turned on, this causes the electric potential at the capacitor terminal 106 to be equal to the input voltage Vin, thereby causing the electric potential at the capacitor terminal 104 to be Vin+ΔV. The electric potential at the capacitor terminal 104 is applied to the output capacitor Co1 through the fourth switch SW4, thereby charging the output capacitor Co1.

The charge pump circuit 120 alternately repeats the charging time period φ1 and the discharging time period φ2 for boosting the input voltage Vin.

The pulse frequency modulator 80 generates a pulse signal Spfm and supplies it to the driver 40. The driver 40 assigns the high time periods TH of the pulse signal Spfm to the charging time periods φ1 or the discharging time periods φ2 and assigns the low time periods TL to the other ones of them, thereby alternately turning on the first group of switches 10 and the second group of switches 12.

Preferably, the driver 40 provides dead times for preventing both the first group of switches 10 and the second group of switches 12 from being turned on at the same time for providing dead times during which both the first group of switches 10 and the second group of switches 20 are off, near the positive edges and the negative edges of the pulse signal Spfm. As the method for setting the dead times, it is possible to employ well-known techniques.

The charge pump circuit 120 according to the present embodiment is characterized in that the pulse signal for driving the first switch SW1 to the fourth switch SW4 is generated through pulse frequency modulation (PFM).

The feedback voltage Vfb corresponding to the output voltage Vout from the charge pump circuit 120 is inputted to the pulse frequency modulator 80. The pulse frequency modulator 80 generates a pulse signal Spfm with a duty ratio fixed to a predetermined value. The pulse frequency modulator 80 adjusts the frequency of the pulse signal Spfm such that the feedback voltage Vfb is coincident with a first reference voltage Vref1.

Figure 2:
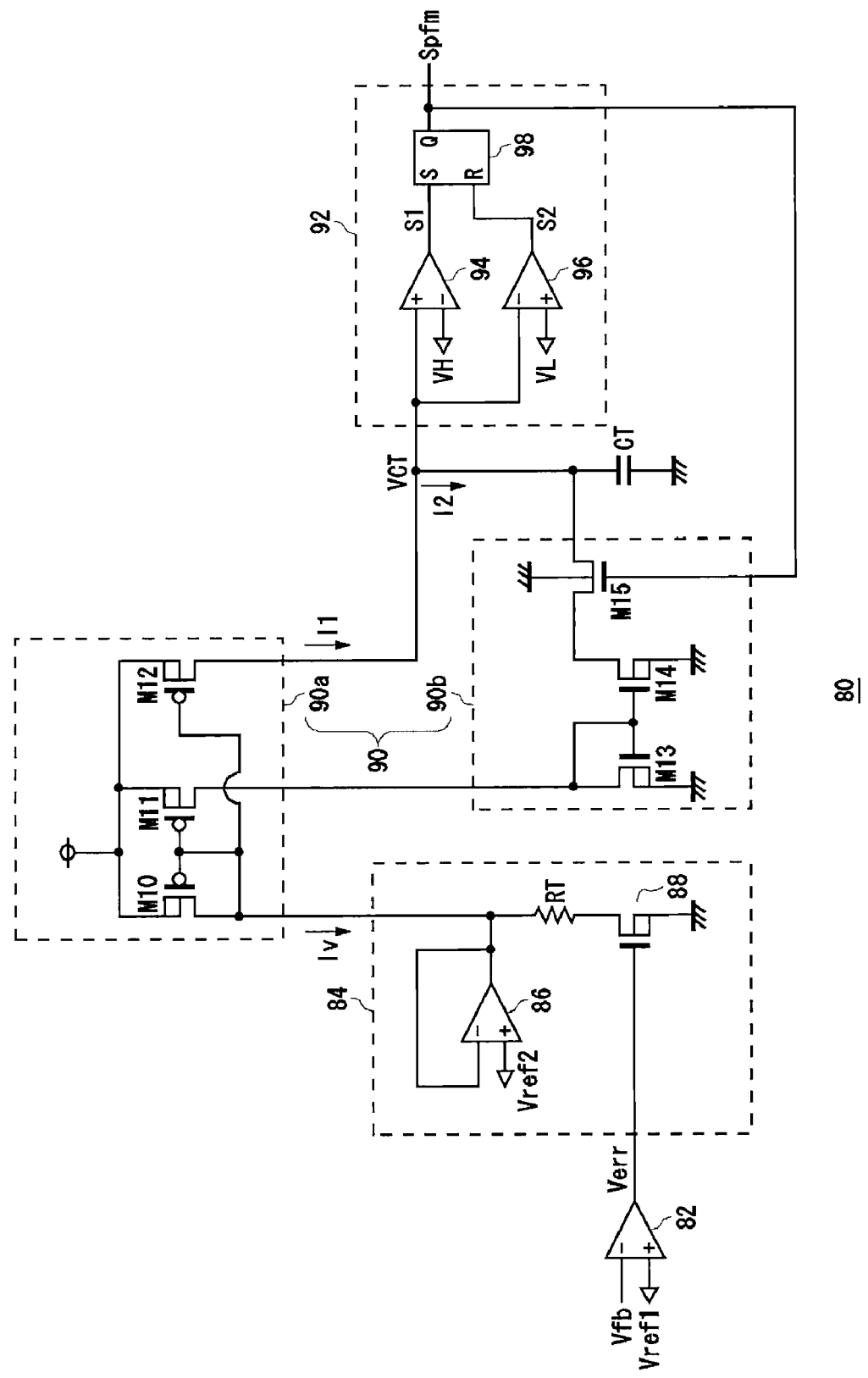
FIG. 2 is a circuit diagram illustrating an example of the structure of a pulse frequency modulator in FIG. 1.

FIG. 2 is a circuit diagram illustrating an example of the structure of the pulse frequency modulator 80 in FIG. 1. The pulse frequency modulator 80 includes an error amplifier 82, an electric current source 84, a charging/discharging circuit 90, and a charging/discharging controller 92.

The error amplifier 82 amplifies the error between the feedback voltage Vfb and the first reference voltage Vref1 to create an error voltage Verr. A charging/discharging capacitor CT is grounded and is fixed in electric potential, at its one end.

The current source 84 generates a variable electric current Iv corresponding to the error voltage Verr. The current source 84 includes a regulator 86, a frequency setting transistor 88 and a maximum frequency setting resistor RT.

The regulator 86 generates a predetermined second reference voltage Vref2. The frequency setting transistor 88 is provided between an output terminal of the regulator 86 and a grounded terminal (a fixed voltage terminal). The error voltage Verr is inputted to the control terminal (the source) of the frequency setting transistor 88. The ON resistance Ron of the frequency setting transistor 88 is adjusted according to the error voltage Verr. The maximum frequency setting resistance RT is provided in serial to the frequency setting transistor 88, between the output terminal of the regulator 86 and the fixed voltage terminal.

The current source 84 outputs the current flowing through the frequency setting transistor 88 as the variable current Iv.

The charging/discharging circuit 90 is switched between a charging state and a discharging state. The charging/discharging circuit 90 charges the charging/discharging capacitor CT with a charging current Ichg proportional to the variable current Iv in the charging state. Further, the charging/discharging circuit 90 discharges the charging/discharging capacitor CT with a discharging current Idis proportional to the variable current Iv in the discharging state. The charging current Ichg and the discharging current Idis are set to be equal to each other.

The charging/discharging circuit 90 includes a first current mirror circuit 90a and a second current mirror circuit 90b. The first current mirror circuit 90a includes transistors M10, M11 and M12 and supplies, to the charging/discharging capacitor CT, a first current I1 generated by multiplying the variable current Iv by a first factor.

The second current mirror circuit 90b includes transistors M13, M14 and M15 and is structured to be capable of being switched between ON and OFF in such a way as to extract, from the charging/discharging capacitor CT, a second current I2 generated by multiplying the variable current Iv by a second factor in its ON state. The second current mirror circuit 90b is switched between ON and OFF by the transistor M15.

The charging/discharging circuit 90 outputs the first current I1 as the charging current Ichg when the second current mirror circuit 90b is off and outputs the differential current (I2−I1) between the second current I2 and the first current I1 as the discharging current Idis when the second current mirror circuit 90b is on. When the second factor is set to be twice the first factor, Ichg is equal to Idis.

The charging/discharging controller 92 compares the capacitor voltage VCT generated at the other end of the charging/discharging capacitor CT with a predetermined upper limit voltage VH and a predetermined lower limit voltage VL. If the capacitor voltage VCT reaches the upper limit voltage VH, the charging/discharging controller 92 puts the charging/discharging circuit 90 into the discharging state. Further, if the capacitor voltage VCT drops to the lower limit voltage VL, the charging/discharging controller 92 puts the charging/discharging circuit 90 into the charging state.

The charging/discharging controller 92 includes a first comparator 94, a second comparator 96 and a flip flop 98. The first comparator 94 compares the capacitor voltage VCT with the upper limit voltage VH and generates a first signal S1 with a first edge, at the timing when the capacitor voltage VCT reaches the upper limit voltage VH. The second comparator 96 compares the capacitor voltage VCT with the lower limit voltage VL and generates a second signal S2 with a second edge, at the timing when the capacitor voltage VCT drops to the lower limit voltage VL. The flip flop 98 is set and reset by the first edge and the second edge of the first signal S1 and the second signal S2. The charging/discharging controller 92 outputs, as the pulse signal Spfm, the output of the flip flop 98.

The pulse signal Spfm is inputted to the gate (the control terminal) of the transistor M15 in the second current mirror circuit 90b. Accordingly, the second current mirror circuit 90b is switched between ON and OFF according to the output from the flip flop 98.

With the pulse frequency modulator 80 in FIG. 2, it is possible to create a pulse signal Spfm with a frequency which is controlled such that the output voltage Vout is coincident with a target value.

The output impedance of the charge pump circuit 120, namely the load driving capacity thereof, depends on the switching frequency. Therefore, the output voltage Vout is fed back, and the switching frequency is adjusted, which can maintain the output voltage Vout at a constant value, without providing a linear regulator. The charge pump circuit 120 requires no linear regulator, thereby offering the advantage of reduction of the circuit area.

Further, the charge pump circuit 120 according to the present embodiment can reduce the electric power consumption or can increase the efficiency of the power supply, since the switching frequency is reduced when the load is smaller. In cases where a pulse signal with a fixed duty or a fixed frequency is generated for driving the charge pump circuit while the output voltage is adjusted through a linear regulator as in the prior art, the charge pump circuit operates at the same frequency regardless of the amount of the load. In order to switch the first switch SW1 to the fourth switch SW4 in the charge pump circuit 120 between ON and OFF, there is a need for changing the gate voltages of the respective transistors. Accordingly, if the charge pump circuit 120 is driven at a higher frequency when the load is smaller, this will reduce the efficiency of the power supply. The charge pump circuit 120 according to the present embodiment can overcome the aforementioned problem.

There has been described the charge pump circuit 120 according to the present embodiment. The aforementioned embodiment is merely illustrative, and those skilled in the art will understand that variations can be made to the combination of respective components and respective processing processes, and such variations are also covered by the scope of the present invention. Hereinafter, such variations will be described.

Figure 3:
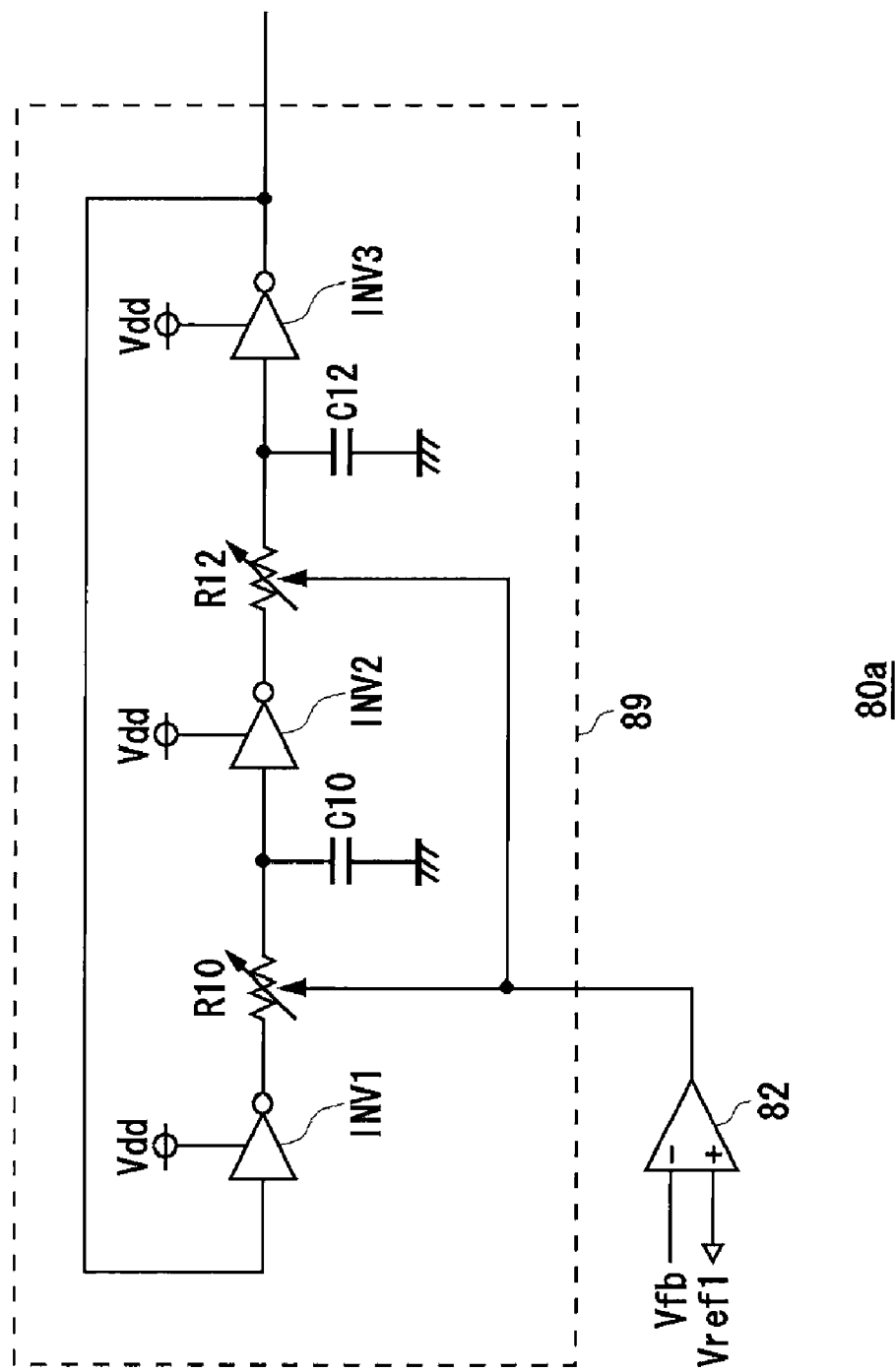
FIG. 3 is a circuit diagram illustrating another example of the structure of the pulse frequency modulator.

FIG. 3 is a circuit diagram illustrating another example of the structure of the pulse frequency modulator. The pulse frequency modulator 80a includes an error amplifier 82 and a ring oscillator 89.

The ring oscillator 89 includes a plurality of inverters INV1 to INV3, variable resistances R10 and R12, and capacitors C10 and C12. The number of stages of the inverters is arbitrary and is not limited to three.

The variable resistance R10 and the capacitor C10 form a low pass filter and are provided between the inverters INV1 and INV2. Similarly, the variable resistance R12 and the capacitor C12 form a low pass filter and are provided between the inverters INV2 and INV3. The resistance values of the variable resistances R10 and R12 are set according to the error voltage Verr from the error amplifier 82.

With the pulse frequency modulator 80a in FIG. 3, it is possible to change the oscillation frequency of the ring oscillator 89, in conjunction with the resistance value of the variable resistances R10 and R12.

Also, it is possible to change the power-supply voltage Vdd for the inverters INV1 to INV3 or the capacitance values of the capacitors C10 and C12, according to the error voltage Verr, instead of changing the resistance values of the variable resistances R10 and R12.

The pulse frequency modulator 80a in FIG. 3 can simplify the circuit in comparison with the pulse frequency modulator 80 in FIG. 2 and, therefore, is advantageous in terms of the circuit area and the current consumption.

The structure of the charge pump circuit is not limited to the topology of FIG. 1. For example, it is possible to employ diodes instead of the transistor switches. Further, while, in the embodiment, there has been described a charge pump circuit with a voltage-boosting ratio of 2, the present invention can be applied to a sum-type charge pump circuit for summing two input voltages. In this case, the first switch SW1 and the third switch SW3 are separated from each other at their common connection terminals, and a first input terminal and a second input terminal can be provided. Further, the first switch SW1 is connected at its one end to the first input terminal, and the third switch SW3 is connected at its one end to the second input terminal.

Further, the present invention can be applied to a charge pump circuit with a voltage-boosting ratio of 1.5 or 4 or can be applied to a charge pump circuit having a plurality of voltage-boosting ratios in such a way as to enable switching thereamong. Also, the present invention can be applied to a voltage-inversion type charge pump circuit for generating a negative voltage.

While, in the present embodiment, there has been described a case where the first switch SW1 to the fourth switch SW4 are incorporated in the control circuit 100, they can be provided outside the control circuit 100 using discrete devices.

The logic levels of respective signals are not limited to those described in the embodiment and can be properly inverted as required.

While the preferred embodiments of the present invention have been described using specific terms, such description is for illustrative purposes only, and it is to be understood that changes and variations may be made without departing from the spirit or scope of the appended claims.

What is claimed is:

1. A control circuit for a charge pump circuit including at least a single flying capacitor and at least a single output capacitor, comprising:
   a first group of switches including at least a single switch provided on a path which charges said flying capacitor using an input voltage;
   a second group of switches including at least a single switch provided on a path which charges said output capacitor using the electric charge accumulated in said flying capacitor;
   a pulse modulator which generates a pulse signal having a fixed duty ratio and a frequency which is adjusted such that a feedback voltage corresponding to the output voltage of said charge pump circuit is coincident with a predetermined first reference voltage; and
   a driver which receives said pulse signal and turns on one of said first and second groups of switches during the time periods corresponding to the high time periods of said pulse signal and turns on the other one of said first and second groups of switches during the time periods corresponding to the low time periods of said pulse signal;
   wherein said pulse modulator comprises:
      an error amplifier which amplifies the error between said feedback voltage and said first reference voltage and generates an error voltage;
      a charging/discharging capacitor which is fixed in electric potential at its one end;
      an electric current source which generates a variable electric current corresponding to said error voltage;
      a charging/discharging circuit which charges said charging/discharging capacitor with a charging current proportional to said variable current in a charging state and discharges said charging/discharging capacitor with a discharging current proportional to said variable current in a discharging state; and
      a charging/discharging controller which compares the capacitor voltage generated at the other end of said charging/discharging capacitor with a predetermined upper limit voltage and a predetermined lower limit voltage and puts said charging/discharging circuit into said discharging state if said capacitor voltage reaches said upper limit voltage and puts said charging/discharging circuit into said charging state if said capacitor voltage drops to said lower limit voltage;
      wherein the level of said pulse signal is changed at the timing of the transition between said charging state and said discharging state.

2. The control circuit according to claim 1, wherein said charging current and said discharging current are equal to each other.

3. The control circuit according to claim 1, wherein said charging/discharging circuit comprises:
   a first current mirror circuit which supplies a first current to said charging/discharging capacitor, said first current being generated by multiplying said variable current by a first factor; and
   a second current mirror circuit which can be switched between ON and OFF and extracts a second current from said charging/discharging capacitor, said second current being generated by said variable current by a second factor,
   said charging/discharging circuit outputs said first current as said charging current and outputs the differential current between said second current and said first current, as said discharging current,
   said charging/discharging controller comprises:
   a first comparator which compares said capacitor voltage with said upper limit voltage and generates a first signal having a first edge at the timing when said capacitor voltage reaches said upper limit voltage;
   a second comparator which compares said capacitor voltage with said lower limit voltage and generates a second signal having a second edge at the timing when said capacitor voltage drops to said lower limit voltage; and
   a flip flop which is set and reset by said first and second edges of said first and second signals,
   said charging/discharging controller outputs the output of said flip flop as said pulse signal and switches said second current mirror between ON and OFF according to the output of said flip flop.

4. The control circuit according to claim 1, wherein said current source comprises:
   a regulator which generates a predetermined second reference voltage; and
   a frequency setting transistor which is provided between an output terminal of said regulator and a fixed voltage terminal and is structured such that said error voltage is inputted to its control terminal,
   said current source outputs a current flowing though said frequency setting transistor, as said variable current.

5. The control circuit according to claim 4, wherein said current source further comprises a maximum frequency setting resistance provided in serial to said frequency setting transistor, between the output terminal of said regulator and said fixed voltage terminal.

6. The control circuit according to claim 1, wherein said pulse modulator comprises:
   an error amplifier which amplifies the error between said feedback voltage and said first reference voltage and generates an error voltage; and
   a ring oscillator which oscillates at a frequency corresponding to said error voltage.

7. A charge pump circuit comprising:
   a flying capacitor;
   an output capacitor; and
   a control circuit which controls charging and discharging states of said flying capacitor and said output capacitor, the control circuit comprising:
      a first group of switches including at least a single switch provided on a path which charges said flying capacitor using an input voltage;
      a second group of switches including at least a single switch provided on a path which charges said output capacitor using the electric charge accumulated in said flying capacitor;
      a pulse modulator which generates a pulse signal having a fixed duty ratio and a frequency which is adjusted such that a feedback voltage corresponding to the output voltage of said charge pump circuit is coincident with a predetermined first reference voltage; and
      a driver which receives said pulse signal and turns on one of said first and second groups of switches during the time periods corresponding to the high time periods of said pulse signal and turns on the other one of said first and second groups of switches during the time periods corresponding to the low time periods of said pulse signal;
      wherein said pulse modulator comprises:

an error amplifier which amplifies the error between said feedback voltage and said first reference voltage and generates an error voltage;

a charging/discharging capacitor which is fixed in electric potential at its one end;

an electric current source which generates a variable electric current corresponding to said error voltage;

a charging/discharging circuit which charges said charging/discharging capacitor with a charging current proportional to said variable current in a charging state and discharges said charging/discharging capacitor with a discharging current proportional to said variable current in a discharging state; and a charging/discharging controller which compares the capacitor voltage generated at the other end of said charging/discharging capacitor with a predetermined upper limit voltage and a predetermined lower limit voltage and puts said charging/discharging circuit into said discharging state if said capacitor voltage reaches said upper limit voltage and puts said charging/discharging circuit into said charging state if said capacitor voltage drops to said lower limit voltage;

wherein the level of said pulse signal is changed at the timing of the transition between said charging state and said discharging state.

8. A control method for a charge pump circuit including at least a single flying capacitor and at least a single output capacitor, comprising:

amplifying the error between a feedback voltage corresponding to the output voltage of said charge pump circuit and a predetermined first reference voltage and generating an error voltage;

generating a variable electric current corresponding to said error voltage;

comparing the capacitor voltage generated in a charging/discharging capacitor which is fixed in electric potential at its one end with a predetermined upper limit voltage and a predetermined lower limit voltage, the capacitor voltage being generated at the other end of said charging/discharging capacitor;

starting discharging said charging/discharging capacitor with a discharging current proportional to said variable current when said capacitor voltage reaches said upper limit voltage;

starting charging said charging/discharging capacitor with a charging current proportional to said variable current when said capacitor voltage drops to said lower limit voltage;

generating a pulse signal which is changed between a high level and a low level, on the basis of the result of the comparison of said capacitor voltage; and performing switching for, on the basis of said pulse signal, alternately repeating a step of charging said flying capacitor using an input voltage and a step of charging said output capacitor using the electric charge accumulated in said flying capacitor.

* * * * *